(12) United States Patent
Mei

(10) Patent No.: US 12,344,787 B2
(45) Date of Patent: Jul. 1, 2025

(54) QUANTUM DOT LIGHT-EMITTING STRUCTURE AND MANUFACTURING METHOD THEREOF, AND DISPLAY APPARATUS

(71) Applicant: BOE TECHNOLOGY GROUP CO., LTD., Beijing (CN)

(72) Inventor: Wenhai Mei, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 697 days.

(21) Appl. No.: 17/628,594

(22) PCT Filed: Apr. 15, 2021

(86) PCT No.: PCT/CN2021/087460
§ 371 (c)(1),
(2) Date: Jan. 20, 2022

(87) PCT Pub. No.: WO2021/238487
PCT Pub. Date: Dec. 2, 2021

(65) Prior Publication Data
US 2022/0251446 A1    Aug. 11, 2022

(30) Foreign Application Priority Data
May 27, 2020   (CN) .......................... 202010459926.2

(51) Int. Cl.
*C09K 11/88*   (2006.01)
*C09K 11/56*   (2006.01)
(Continued)

(52) U.S. Cl.
CPC .......... *C09K 11/883* (2013.01); *C09K 11/565* (2013.01); *G03F 7/0045* (2013.01);
(Continued)

(58) Field of Classification Search
None
See application file for complete search history.

(56) References Cited

U.S. PATENT DOCUMENTS

2018/0108842 A1\* 4/2018 Li ........................... G03F 7/094
2020/0249570 A1\* 8/2020 Talapin ................. G03F 7/0045
(Continued)

FOREIGN PATENT DOCUMENTS

CN   110590549 A   12/2019
CN   110832618 A  \*  2/2020 ........... G03F 7/0045
(Continued)

OTHER PUBLICATIONS

Cho, Himchan; "Direct Optical Patterning of Quantum Dot Light Emitting Diodes via In Situ Ligand Exchange"; Advanced Materials, Oct. 1, 2020, pp. 2003805 (2 of 8) to 2003805 (8 of 8).

*Primary Examiner* — Mark F. Huff
*Assistant Examiner* — Richard David Champion
(74) *Attorney, Agent, or Firm* — Chiwin Law LLC

(57) ABSTRACT

A quantum dot light-emitting structure, a manufacturing method thereof and a display apparatus. The manufacturing method includes: providing quantum dot solution, the quantum dot solution including a first quantum dot which surface is modified with a first ligand and a photo-ligand remover, and the first ligand being dissolved in a rinsing solvent; coating the quantum dot solution on a base substrate to form a first quantum dot light-emitting material layer; partially exposing the first quantum dot light-emitting material layer, so that the first quantum dot light-emitting material layer includes an exposed portion and an unexposed portion, the photo-ligand remover being configured to release a ligand remover under irradiation, to remove the first ligand in the exposed portion of the first quantum dot light-emitting material layer; and developing and rinsing the exposed first
(Continued)

quantum dot light-emitting material layer by using the rinsing solvent, to form the first quantum dot light-emitting layer.

18 Claims, 8 Drawing Sheets

(51) Int. Cl.
| | |
|---|---|
| *G03F 7/004* | (2006.01) |
| *G03F 7/32* | (2006.01) |
| *G03F 7/34* | (2006.01) |
| *B82Y 20/00* | (2011.01) |
| *B82Y 30/00* | (2011.01) |
| *B82Y 40/00* | (2011.01) |
| *H10K 50/115* | (2023.01) |
| *H10K 71/00* | (2023.01) |

(52) U.S. Cl.
CPC ............... *G03F 7/325* (2013.01); *G03F 7/34* (2013.01); *B82Y 20/00* (2013.01); *B82Y 30/00* (2013.01); *B82Y 40/00* (2013.01); *H10K 50/115* (2023.02); *H10K 71/00* (2023.02)

(56) References Cited

U.S. PATENT DOCUMENTS

| | | | |
|---|---|---|---|
| 2021/0024819 A1* | 1/2021 | Kang | .................. G02B 5/20 |
| 2021/0388259 A1 | 12/2021 | Mei et al. | |
| 2022/0376180 A1* | 11/2022 | Steiger | .................. G03F 7/0047 |

FOREIGN PATENT DOCUMENTS

| | | | | |
|---|---|---|---|---|
| EP | 3410208 A1 * | 12/2018 | .......... | G03F 7/0047 |
| JP | 2014174406 A | 9/2014 | | |
| JP | 2015018131 A | 1/2015 | | |
| KR | 2021012828 A * | 2/2021 | ............... | G02B 5/20 |

* cited by examiner

QUANTUM DOT LIGHT-EMITTING STRUCTURE AND MANUFACTURING METHOD THEREOF, AND DISPLAY APPARATUS

This application is a U.S. National Phase Entry of International Application No. PCT/CN2021/087460 filed on Apr. 15, 2021, designating the United States of America and claiming priority to Chinese Patent Application No. 202010459926.2, filed on May 27, 2020. The present application claims priority to and the benefit of the above-identified applications and the above-identified applications are incorporated by reference herein in their entirety.

TECHNICAL FIELD

Embodiments of the present disclosure relate to a quantum dot light-emitting structure and a manufacturing method thereof, and a display apparatus.

BACKGROUND

Active Matrix Organic Light-Emitting Diode (AMOLED) display apparatuses are considered to be the next generation of display technology to replace Liquid Crystal Display (LCD) apparatuses, due to advantages such as wide viewing angle, high refresh rate, low power consumption, and flexible display. With continuous development of the consumer market, consumers have higher and higher requirements for resolution of display apparatuses. An organic light-emitting layer of the Active Matrix Organic Light-Emitting Diode (AMOLED) display apparatus is usually manufactured by an evaporation process or an inkjet printing process; on account of difficulties in alignment and insufficient control of an evaporation region, etc., it is difficult for an organic light-emitting layer formed by the evaporation process to achieve high resolution; and it is also difficult for an organic light-emitting layer formed by the inkjet printing process to achieve high resolution. Therefore, resolution of the Active Matrix Organic Light-Emitting Diode (AMOLED) display apparatus is relatively low, making it difficult to compete with the Liquid Crystal Display (LCD) apparatus.

On the other hand, with continuous development of a Quantum Dot Light-Emitting Diode (QLED) display technology, quantum efficiency thereof constantly improves, which has basically reached an industrialization level. Therefore, the Quantum Dot Light-Emitting Diode (QLED) display technology has gradually become a research hotspot.

SUMMARY

Embodiments of the present disclosure provide a quantum dot light-emitting structure and a manufacturing method thereof, and a display apparatus. The manufacturing method of the quantum dot light-emitting structure changes solubleness of a first quantum dot required to remain by exposing, to implement patterning of a first quantum dot light-emitting layer, without using violent methods such as the ultrasonic lift-off process or the polar aprotic solvent boiling process, which, thus, can ensure complete morphology of the first quantum dot light-emitting layer, and can further ensure light-emitting performance of the quantum dot light-emitting structure.

At least one embodiment of the present disclosure provides a manufacturing method of a quantum dot light-emitting structure. The manufacturing method includes: providing first quantum dot solution, the first quantum dot solution including a first quantum dot which surface is modified with a first ligand and a photo-ligand remover, and the first ligand being dissolved in a first rinsing solvent; coating the first quantum dot solution on a base substrate to form a first quantum dot light-emitting material layer; partially exposing the first quantum dot light-emitting material layer, so that the first quantum dot light-emitting material layer includes an exposed portion and an unexposed portion, the photo-ligand remover being configured to release a ligand remover under irradiation, to remove the first ligand in the exposed portion of the first quantum dot light-emitting material layer; and developing and rinsing the exposed first quantum dot light-emitting material layer by using the first rinsing solvent, to form the first quantum dot light-emitting layer.

For example, in a manufacturing method of a quantum dot light-emitting structure provided by an embodiment of the present disclosure, the photo-ligand remover includes a photoacid generator.

For example, in a manufacturing method of a quantum dot light-emitting structure provided by an embodiment of the present disclosure, the photoacid generator includes at least one of triazine-based compounds, iodonium salt-based compounds, sulfonium-based compounds, and perfluorobutyl-based compounds.

For example, in a manufacturing method of a quantum dot light-emitting structure provided by an embodiment of the present disclosure, in the first quantum dot solution, a mass percentage ratio of the photo-ligand remover to the first quantum dot which surface is modified with the first ligand is in a range of 4% to 6%.

For example, in a manufacturing method of a quantum dot light-emitting structure provided by an embodiment of the present disclosure, the first rinsing solvent includes at least one of aromatic hydrocarbons such as toluene, xylene, and chlorobenzene.

For example, in a manufacturing method of a quantum dot light-emitting structure provided by an embodiment of the present disclosure, the partially exposing the first quantum dot light-emitting material layer includes: partially exposing the first quantum dot light-emitting material layer with ultraviolet light, to form the exposed portion and the unexposed portion, energy of the ultraviolet light being within a range of 90 mJ/cm$^2$ to 500 mJ/cm$^2$.

For example, a manufacturing method of a quantum dot light-emitting structure provided by an embodiment of the present disclosure further includes annealing the base substrate on which the first quantum dot light-emitting layer is formed, a temperature of the annealing treatment being in a range of 80 to 180 degrees Celsius, and duration of the annealing treatment being in a range of 5 to 30 minutes. For example, in a manufacturing method of a quantum dot light-emitting structure provided by an embodiment of the present disclosure, the first quantum dot light-emitting layer is configured to emit light with a wavelength ranging from 455 to 492 nanometers.

For example, a manufacturing method of a quantum dot light-emitting structure provided by an embodiment of the present disclosure further includes providing second quantum dot solution, the second quantum dot solution comprising a second quantum dot which surface is modified with a second ligand and a photo-ligand remover, and the second ligand being dissolved in a second rinsing solvent; coating the second quantum dot solution on a base substrate on which the first quantum dot light-emitting layer is formed to form a second quantum dot light-emitting material layer; partially exposing the second quantum dot light-emitting material layer, so that the second quantum dot light-emitting material layer includes an exposed portion and an unexposed portion, the photo-ligand remover being configured to release a ligand remover under irradiation, to remove the second ligand in the exposed portion of the second quantum dot light-emitting material layer; and developing and rinsing the exposed second quantum dot light-emitting material layer by using the second rinsing solvent, to form the second quantum dot light-emitting layer.

For example, in a manufacturing method of a quantum dot light-emitting structure provided by an embodiment of the present disclosure, a material of the second ligand and a material of the first ligand are the same, and a material of the second rinsing solvent and a material of the first rinsing solvent are the same.

For example, in a manufacturing method of a quantum dot light-emitting structure provided by an embodiment of the present disclosure, before the forming the first quantum dot light-emitting material layer on the base substrate, the manufacturing method further includes: forming a first photoresist pattern on the base substrate, the first photoresist pattern including a first opening; providing second quantum dot solution; coating the second quantum dot solution on a side of the first photoresist pattern away from the base substrate to form a second quantum dot light-emitting material layer, the second quantum dot light-emitting material layer including a portion covering the first photoresist pattern and a portion located in the first opening; and lifting off the first photoresist pattern, so that a portion of the second quantum dot light-emitting material layer that covers the first photoresist pattern is removed, and a portion of the second quantum dot light-emitting material layer that is located in the first opening remains, to form a second quantum dot light-emitting layer.

For example, a manufacturing method of a quantum dot light-emitting structure provided by an embodiment of the present disclosure further includes forming a second photoresist pattern on the base substrate on which the second quantum dot light-emitting layer is formed, the second photoresist pattern comprising a second opening; providing third quantum dot solution; coating the third quantum dot solution on the base substrate on which the second quantum dot light-emitting layer is formed to form a third quantum dot light-emitting material layer, the third quantum dot light-emitting material layer including a portion covering the second photoresist pattern and a portion located in the second opening; and lifting off the second photoresist pattern, so that the portion of the third quantum dot light-emitting material layer that covers the second photoresist pattern is removed, and the portion of the third quantum dot light-emitting material layer that is located in the second opening remains, to form a third quantum dot light-emitting layer.

For example, in a manufacturing method of a quantum dot light-emitting structure provided by an embodiment of the present disclosure, the second quantum dot light-emitting layer is configured to emit light with a wavelength ranging from 622 to 770 nanometers, and the third quantum dot light-emitting layer is configured to emit light with a wavelength ranging from 492 to 577 nanometers.

For example, in a manufacturing method of a quantum dot light-emitting structure provided by an embodiment of the present disclosure, the second quantum dot solution includes a second quantum dot which surface is modified with a second ligand, the third quantum dot solution includes a third quantum dot which surface is modified with a third ligand, the second ligand and the third ligand both include photodegradable chemical bonds, and the manufacturing method further includes: irradiating the substrate on which the second quantum dot light-emitting layer and the third quantum dot light-emitting layer are formed, so that the photodegradable chemical bonds in the second ligand and the third ligand are broken.

For example, in a manufacturing method of a quantum dot light-emitting structure provided by an embodiment of the present disclosure, the lifting off the first photoresist pattern or the second photoresist pattern includes: lifting off the first photoresist pattern or the second photoresist pattern by using at least one of an ultrasonic lift-off process and a polar aprotic solvent boiling process.

For example, in a manufacturing method of a quantum dot light-emitting structure provided by an embodiment of the present disclosure, before the forming the first quantum dot light-emitting material layer on the base substrate, the manufacturing method further includes: forming a first sacrificial layer on the base substrate; forming a third photoresist pattern on a side of the first sacrificial layer away from the base substrate, the third photoresist pattern including a third opening; patterning the first sacrificial layer with the third photoresist pattern as a mask, and removing a portion of the first sacrificial layer that is located in the third opening; providing second quantum dot solution; coating the second quantum dot solution on a side of the third photoresist pattern away from the base substrate to form a second quantum dot light-emitting material layer, the second quantum dot light-emitting material layer including a portion covering the third photoresist pattern and a portion located in the third opening; and lifting off the third photoresist pattern and the first sacrificial layer, so that the portion of the second quantum dot light-emitting material layer that covers the third photoresist pattern is removed, and the portion of the second quantum dot light-emitting material layer that is located in the third opening remains, to form a second quantum dot light-emitting layer.

For example, a manufacturing method of a quantum dot light-emitting structure provided by an embodiment of the present disclosure further includes: forming a second sacrificial layer on the base substrate on which the second quantum dot light-emitting layer is formed; forming a fourth photoresist pattern on a side of the second sacrificial layer away from the base substrate, the fourth photoresist pattern including a fourth opening; patterning the second sacrificial layer with the fourth photoresist pattern as a mask, and removing the portion of the second sacrificial layer that is located in the fourth opening; providing third quantum dot solution; coating the third quantum dot solution on the base substrate on which the second quantum dot light-emitting layer is formed, to form a third quantum dot light-emitting material layer, the third quantum dot light-emitting material layer including a portion covering the fourth photoresist pattern and a portion located in the fourth opening, and lifting off the fourth photoresist pattern and the second sacrificial layer, so that the portion of the third quantum dot light-emitting material layer that covers the fourth photoresist pattern is removed, and the portion of the third quantum dot light-emitting material layer that is located in the fourth opening remains, to form the third quantum dot light-emitting layer.

At least one embodiment of the present disclosure further provides a quantum dot light-emitting structure. The quantum dot light-emitting structure includes a base substrate; a first quantum dot light-emitting layer, located on the base substrate; and a second quantum dot light-emitting layer, located on the base substrate. A ligand content of the first quantum dot light-emitting layer is less than 60% of a ligand content of the second quantum dot light-emitting layer.

For example, in a quantum dot light-emitting structure provided by an embodiment of the present disclosure, the first quantum dot light-emitting layer includes a first quantum dot which surface is modified with a first ligand, a first quantum dot which surface is not modified with a ligand, and a photo-ligand remover.

For example, in a quantum dot light-emitting structure provided by an embodiment of the present disclosure, the photo-ligand remover includes a photoacid generator.

For example, in a quantum dot light-emitting structure provided by an embodiment of the present disclosure, the photoacid generator includes at least one of triazine-based compounds, iodonium salt-based compounds, sulfonium-based compounds, and perfluorobutyl-based compounds.

For example, in a quantum dot light-emitting structure provided by an embodiment of the present disclosure, the first quantum dot light-emitting layer is configured to emit light with a wavelength ranging from 455 to 492 nanometers, and the second quantum dot light-emitting layer is configured to emit light with a wavelength ranging from 622 to 770 nanometers or light with a wavelength ranging from 492 to 577 nanometers.

At least one embodiment of the present disclosure further provides a display apparatus, including any of the above described quantum dot light-emitting structure.

BRIEF DESCRIPTION OF THE DRAWINGS

In order to clearly illustrate the technical solution of the embodiments of the disclosure, the drawings of the embodiments will be briefly described as follows; it is obvious that the described drawings are only related to some embodiments of the disclosure and thus are not limitative of the disclosure.

DETAILED DESCRIPTION

Figure 1:
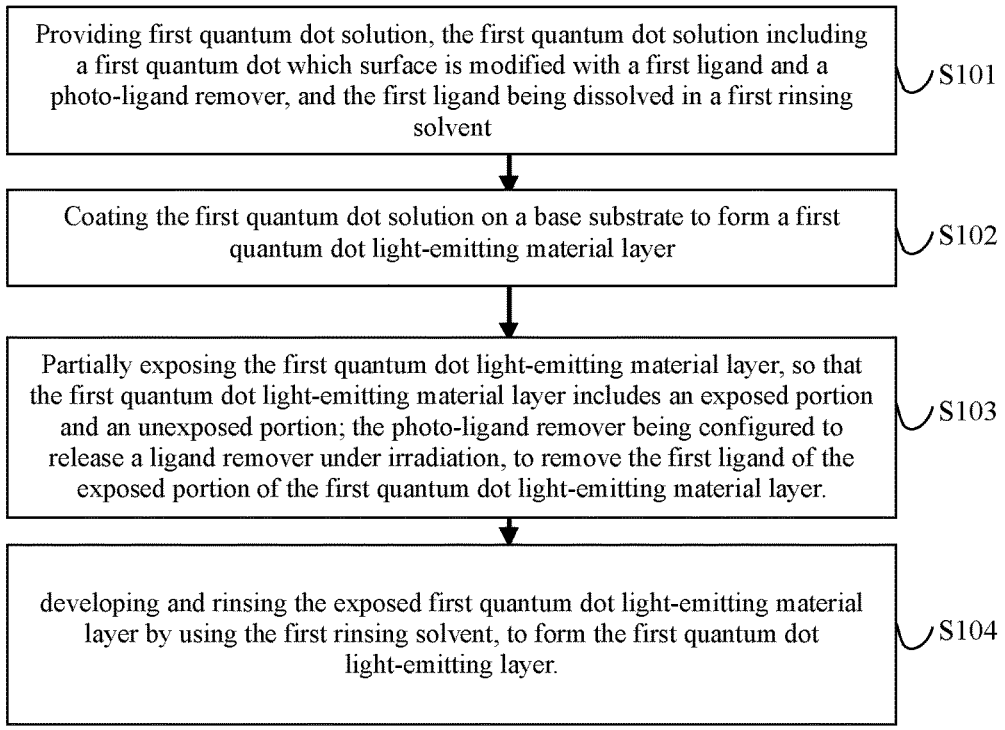
FIG. 1 is a flow chart of a manufacturing method of a quantum dot light-emitting structure provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "include," etc., are intended to specify that the elements or the objects stated before these terms encompass the elements or the objects and equivalents thereof listed after these terms, but do not preclude the other elements or objects.

The Quantum Dot Light-Emitting Diode (QLED) display technology may adopt photoresist for a lift-off process or a process similar to lift-off, to pattern a quantum dot light-emitting layer. However, in the process of lifting off the photoresist, violent methods such as an ultrasonic lift-off process or a polar aprotic solvent boiling process are usually required. These violent methods are likely to cause damage to morphology of a functional film layer that has been prepared, thereby affecting light-emitting performance of the finally formed quantum dot light-emitting structure. Moreover, blue light quantum dots are less stable than red and green light quantum dots, due to a wider band gap thereof. Accordingly, the blue light quantum dots are less resistant to the lift-off process during patterning and are easily damaged, resulting in low brightness of blue light in a full-color Quantum Dot Light-Emitting Diode (QLED) display apparatus, and failure to achieve an effect of full-color display.

In this regard, embodiments of the present disclosure provide a quantum dot light-emitting structure and a manufacturing method thereof, and a display apparatus. The manufacturing method of the quantum dot light-emitting structure includes: providing first quantum dot solution, the first quantum dot solution including a first quantum dot which surface is modified with a first ligand and a photo-ligand remover, and the first ligand being dissolved in a first rinsing solvent; coating the first quantum dot solution on a base substrate to form a first quantum dot light-emitting material layer; partially exposing the first quantum dot light-emitting material layer, so that the first quantum dot light-emitting material layer includes an exposed portion and an unexposed portion, the photo-ligand remover being configured to release a ligand remover under irradiation, to remove the first ligand in the exposed portion included in the first quantum dot light-emitting material layer; and developing and rinsing the exposed first quantum dot light-emitting material layer by using the first rinsing solvent, to form the first quantum dot light-emitting layer. Therefore, the manufacturing method of the quantum dot light-emitting structure may implement patterning of the first quantum dot light-emitting layer, without using violent methods such as the ultrasonic lift-off process or the polar aprotic solvent boiling process, which, thus, can ensure complete morphology of the first quantum dot light-emitting layer, and can further ensure light-emitting performance of the quantum dot light-emitting structure.

Hereinafter, the quantum dot light-emitting structure and the manufacturing method thereof and the display apparatus provided by the embodiments of the present disclosure will be described in detail in conjunction with the accompanying drawings.

Figure 2A:
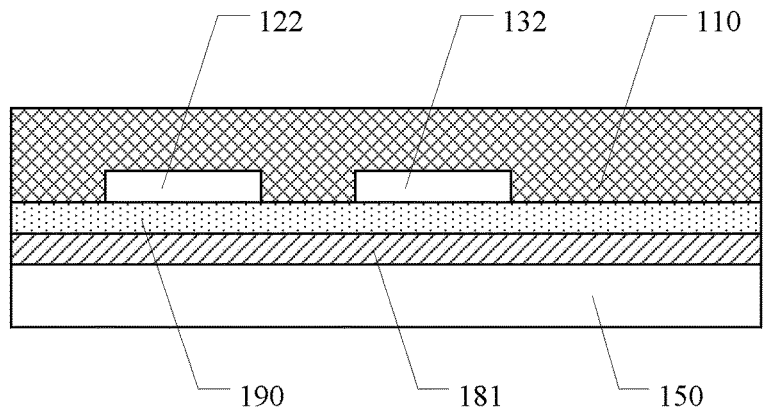
FIG. 2A to FIG. 2C are schematic diagrams of steps of a manufacturing method of a quantum dot light-emitting structure provided by an embodiment of the present disclosure.
Figure 2B:
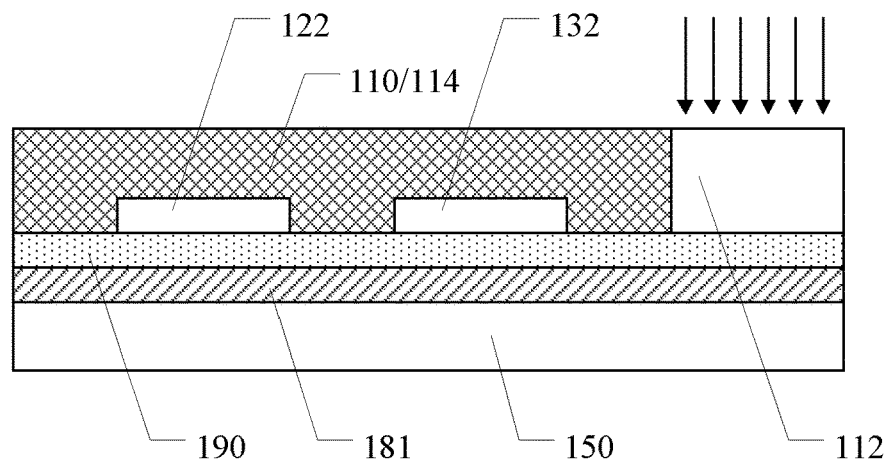
Figure 2C:
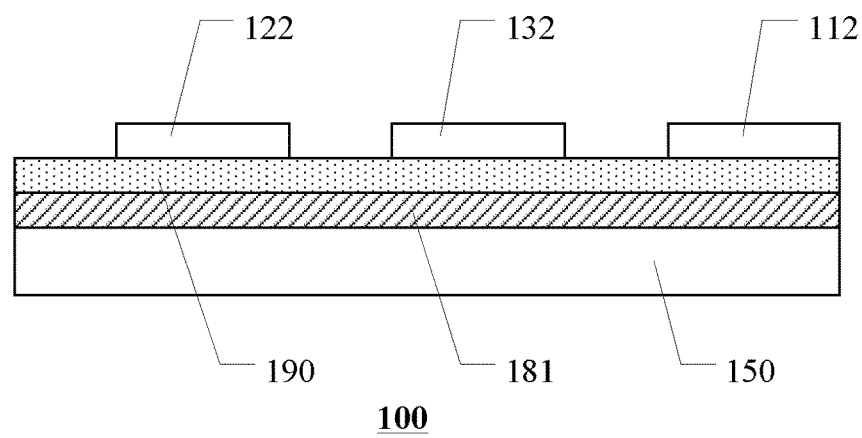

An embodiment of the present disclosure provides a manufacturing method of a quantum dot light-emitting structure. FIG. 1 is a flow chart of a manufacturing method of a quantum dot light-emitting structure provided by an embodiment of the present disclosure; and FIG. 2A to FIG. 2C are schematic diagrams of steps of a manufacturing method of a quantum dot light-emitting structure provided by an embodiment of the present disclosure.

As illustrated in FIG. 1, the manufacturing method of the quantum dot light-emitting structure includes steps S101 to S104 as follows.

Step S101: providing first quantum dot solution, the first quantum dot solution including a first quantum dot which surface is modified with a first ligand and a photo-ligand remover, and the first ligand being dissolved in a first rinsing solvent.

Step S102: coating the first quantum dot solution on a base substrate to form a first quantum dot light-emitting material layer.

As illustrated in FIG. 2A, the first quantum dot solution may be coated on the base substrate 150 by a spin coating process to form the first quantum dot light-emitting material layer 110; and a rotation speed of the spin coating process may be 2,000 rpm to 3,000 rpm, for example, 2,500 rpm. Of course, the embodiment of the present disclosure includes, but is not limited thereto, and the first quantum dot solution may also be coated on the base substrate by using other suitable methods.

Step S103: partially exposing the first quantum dot light-emitting material layer, so that the first quantum dot light-emitting material layer includes an exposed portion and an unexposed portion; the photo-ligand remover being configured to release a ligand remover under irradiation, to remove the first ligand of the exposed portion of the first quantum dot light-emitting material layer.

As illustrated in FIG. 2B, the first quantum dot light-emitting material layer 110 may be partially exposed directly by an exposure machine, so that the first quantum dot light-emitting material layer 110 includes an exposed portion 112 and an unexposed portion 114, and the first ligand of the exposed portion 112 of the quantum dot light-emitting material layer 110 is removed.

Step S104: developing and rinsing the exposed first quantum dot light-emitting material layer by using the first rinsing solvent, so that the unexposed portion of the first quantum dot light-emitting material layer is dissolved and removed by the first rinsing solvent, and the exposed portion of the first quantum dot light-emitting material layer is insoluble in the first rinsing solvent and forms the first quantum dot light-emitting layer.

As illustrated in FIG. 2C, the exposed first quantum dot light-emitting material layer 110 is developed and rinsed by using the first rinsing solvent; since the first ligand is dissolved in the first rinsing solvent, the unexposed portion 114 of the first quantum dot light-emitting material layer 110 is dissolved and removed by the first rinsing solvent, and the exposed portion 112 of the first quantum dot light-emitting material layer 110 is insoluble in the first rinsing solvent, and thus remains on the base substrate 150. The exposed portion 112 of the first quantum dot light-emitting material layer 110 is the first quantum dot light-emitting layer 112.

In the manufacturing method of the quantum dot light-emitting structure provided by the embodiment of the present disclosure, the manufacturing method of the quantum dot light-emitting structure allows the photo-ligand remover to release the ligand remover under irradiation by an exposure process, to remove the first ligand in the exposed portion of the first quantum dot light-emitting material layer, so that the exposed portion of the first quantum dot light-emitting material layer is insoluble in the first rinsing solvent, to remain on the base substrate and form the first quantum dot light-emitting layer, while the unexposed portion of the first quantum dot light-emitting material layer will be dissolved and removed by the first rinsing solvent. Therefore, the manufacturing method of the quantum dot light-emitting structure may implement patterning of the first quantum dot light-emitting layer, without using violent methods such as the ultrasonic lift-off process or the polar aprotic solvent boiling process, which, thus, may ensure complete morphology of the first quantum dot light-emitting layer, and may further ensure light-emitting performance of the quantum dot light-emitting structure. In addition, since the first quantum dot light-emitting layer may be directly patterned by an exposure process, it may have higher precision with a smaller size, thereby it is favorable for improving resolution of the prepared quantum dot light-emitting structure.

In some examples, the photo-ligand remover may include a photoacid generator. The photoacid generator generates hydrogen ions after being irradiated, and the hydrogen ions combine with the first ligand, thereby removing the first ligand of the exposed portion of the first quantum dot light-emitting material layer. On the other hand, using the photoacid generator to remove the first ligand may also avoid affecting luminous efficiency of the first quantum dots. Of course, the embodiment of the present disclosure includes but is not limited thereto, and the photo-ligand remover may also be other material which can remove the first ligand from the first quantum dot.

For example, the photoacid generator includes at least one of triazine-based compounds, iodonium salt-based compounds, sulfonium-based compounds, and perfluorobutyl-based compounds.

In some examples, in the first quantum dot solution, a mass percentage ratio of the photo-ligand remover to the first quantum dot which surface is modified with the first ligand is in a range of 4% to 6%. For example, the mass percentage ratio of the photo-ligand remover to the first quantum dot which surface is modified with the first ligand is 5%. Therefore, while the photo-ligand remover may better remove the first ligand of the exposed portion of the first quantum dot light-emitting material layer, it may also ensures luminous efficiency of the first quantum dot light-emitting layer formed by the first quantum dot solution.

In some examples, the first rinsing solvent includes at least one of aromatic hydrocarbons such as hexane, octane, toluene, xylene, and chlorobenzene. The first ligand may include oleic acid, oleylamine, octyl mercaptan, dodecyl mercaptan, etc. It should be noted that, the first rinsing solvent may be the same as the solvent in the first quantum dot solution. Of course, the first rinsing solvent may be different from the solvent in the first quantum dot solution. In some examples, the partially exposing the first quantum dot light-emitting material layer includes: partially exposing the first quantum dot light-emitting material layer with ultraviolet light, energy of the ultraviolet light being within a range of 90 mJ/cm$^2$ to 500 mJ/cm$^2$, for example, 100 mJ/cm$^2$. Therefore, the exposure process may effectively cause the photo-ligand remover to release the ligand remover under irradiation.

In some examples, the manufacturing method of the quantum dot light-emitting structure further includes: annealing the base substrate on which the first quantum dot light-emitting layer is formed, a temperature of the annealing treatment being in a range of 80 to 180 degrees Celsius, and duration of the annealing treatment being in a range of 5 to 30 minutes. Therefore, the first quantum dot light-emitting layer formed by the manufacturing method of the quantum dot light-emitting structure has better stability and luminous efficiency.

In some examples, the first quantum dot light-emitting layer is configured to emit blue light, for example, light with a wavelength ranging from 455 to 492 nanometers. Quantum dots emitting blue light are less stable than quantum dots emitting red light due to a wider band gap thereof. Therefore, the manufacturing method of the quantum dot light-emitting structure may implement patterning of the first quantum dot light-emitting layer by the above-described photo-ligand remover, exposure process and rinsing process, without using violent methods such as the ultrasonic lift-off process or the polar aprotic solvent boiling process, which, thus, can ensure complete morphology of the first quantum dot light-emitting layer, and can further ensure light-emitting performance of the quantum dot light-emitting structure.

It should be noted that, the above-described base substrate may include other quantum dot light-emitting layers that have been prepared, for example a quantum dot light-emitting layer emitting red light and a quantum dot light-emitting layer emitting green light. In this case, although a small amount of first quantum dots emitting blue light may remain on the quantum dot light-emitting layer emitting red light and the quantum dot light-emitting layer emitting green light during the process of using the above-described method to form the quantum dot light-emitting layer emitting blue light, yet due to Foster energy transfer between the first quantum dot emitting blue light and the quantum dot emitting red light or green light, there is no color mixing problem of the spectrum.

For example, the first quantum dot may be a CdSe/ZnS quantum dot. Of course, the embodiment of the present disclosure includes but is not limited thereto, the first quantum dot may also be other cadmium-containing quantum dot materials, for example, CdSe/ZnSe, CdS, CdSe, or CdS/ZnS; of course, the first quantum dot may also be a cadmium-free quantum dot, for example, InP/ZnSe, InP/ZnSe/ZnS, ZnSe, InP, PbS, $CsPbCl_3$, $CsPbBr_3$, $CsPhI_3$, ZnSe, InP/ZnS, PbS/ZnS, $CsPbCl_3$/ZnS, $CsPbBr_3$/ZnS, or $CsPhI_3$/ZnS.

For example, the first quantum dot may be a quantum dot with a core-shell structure. Therefore, since the first quantum dot may have a core-shell structure, it may protect the core; and use of a shell material that matches a lattice constant of the core material may better passivate surface defects.

In some examples, the manufacturing method further includes: providing second quantum dot solution, the second quantum dot solution including a second quantum dot which surface is modified with a second ligand and a photo-ligand remover, and the second ligand being dissolved in a second rinsing solvent; coating the second quantum dot solution on a base substrate on which the first quantum dot light-emitting layer is formed to form a second quantum dot light-emitting material layer; partially exposing the second quantum dot light-emitting material layer, so that the second quantum dot light-emitting material layer includes an exposed portion and an unexposed portion, the photo-ligand remover being configured to release a ligand remover under irradiation, to remove the second ligand in the exposed portion of the second quantum dot light-emitting material layer; and developing and rinsing the exposed second quantum dot light-emitting material layer by using the second rinsing solvent, so that the unexposed portion of the second quantum dot light-emitting material layer is dissolved and removed by the second rinsing solvent, and the exposed portion of the second quantum dot light-emitting material layer is insoluble in the second rinsing solvent, to form a second quantum dot light-emitting layer. Therefore, the manufacturing method may implement patterning of the second quantum dot light-emitting layer by the exposure process and the photo-ligand remover, without using violent methods such as the ultrasonic lift-off process or the polar aprotic solvent boiling process, which, thus, can ensure complete morphology of the second quantum dot light-emitting layer, and can further ensure light-emitting performance of the quantum dot light-emitting structure. In addition, since the second quantum dot light-emitting layer may be directly patterned by an exposure process, it may have higher precision with a smaller size, thereby it is favorable for improving resolution of the prepared quantum dot light-emitting structure.

It should be noted that, when the quantum dot light-emitting structure further includes a third quantum dot light-emitting layer, the manufacturing method may further perform patterning of the third quantum dot light-emitting layer by an exposure process and a photo-ligand remover, and the details will be omitted here.

For example, the first quantum dot light-emitting layer is a quantum dot light-emitting layer emitting blue light (e.g., light with a wavelength ranging from 455 to 492 nanometers); and the second quantum dot light-emitting layer is a quantum dot light-emitting layer emitting red light (e.g., light with a wavelength ranging from 622 to 770 nanometers) or green light (light with a wavelength ranging from 492 to 577 nanometers).

In some examples, a material of the second ligand and a material of the first ligand are the same, and a material of the second rinsing solvent and a material of the first rinsing solvent are the same. In some examples, before the forming the first quantum dot light-emitting material layer on the base substrate, the manufacturing method of the quantum dot light-emitting structure further includes: forming a first photoresist pattern on the base substrate, the first photoresist pattern including a first opening; providing second quantum dot solution; coating the second quantum dot solution on a side of the first photoresist pattern away from the base substrate to form a second quantum dot light-emitting material layer, the second quantum dot light-emitting material layer including a portion covering the first photoresist pattern and a portion located in the first opening; and lifting off the first photoresist pattern, so that a portion of the second quantum dot light-emitting material layer that covers the first photoresist pattern is removed, and a portion of the second quantum dot light-emitting material layer that is located in the first opening remains, to form a second quantum dot light-emitting layer. Therefore, the manufacturing method may perform a lift-off process with photoresist, to pattern the second quantum dot light-emitting layer.

FIG. 3A to FIG. 3F are schematic diagrams of steps of a manufacturing method of a quantum dot light-emitting structure provided by an embodiment of the present disclosure.

Figure 3A:
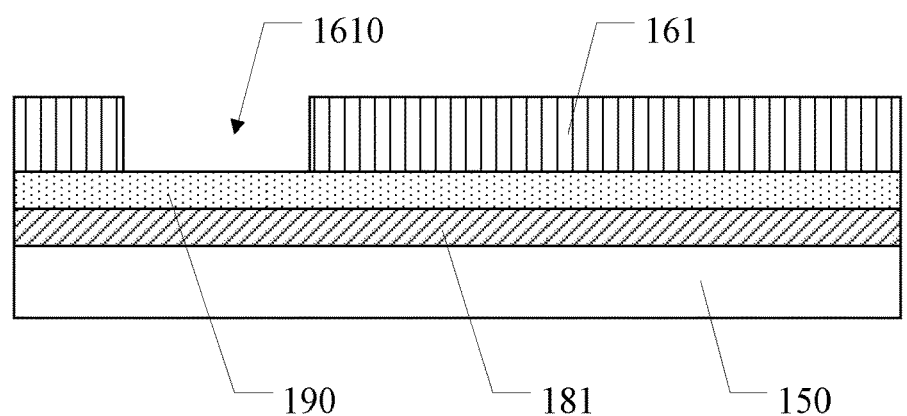
FIG. 3A to FIG. 3F are schematic diagrams of steps of a manufacturing method of a quantum dot light-emitting structure provided by an embodiment of the present disclosure.

As illustrated in FIG. 3A, a first photoresist pattern 161 is formed on the base substrate 150, and the first photoresist pattern 161 includes a first opening 1610.

For example, the base substrate may be a transparent substrate such as a glass substrate, a plastic substrate, a quartz substrate; and the above-described first photoresist pattern may be a negative photoresist material. In addition, the first photoresist pattern may be prepared by coating a photoresist material layer, and then performing exposure and development.

For example, the photoresist material may be coated on the base substrate 150 by a spin coating process with a rotation speed of about 4,000 rpm, the formed photoresist material may be exposed by an exposure process with energy of about 35 mJ/cm$^2$, and then the exposed photoresist material is developed with a solvent such as xylene, to form the above-described first photoresist pattern. Duration of the above-described development process is about 90 seconds.

Figure 3B:
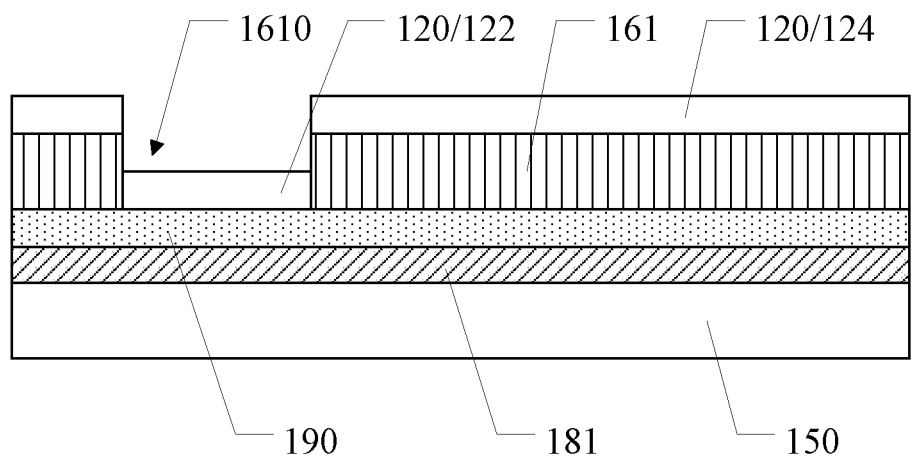

As illustrated in FIG. 3B, the second quantum dot solution is provided, the second quantum dot solution is coated on the side of the first photoresist pattern away from the base substrate to form the second quantum dot light-emitting material layer 120, and the second quantum dot light-emitting material layer 120 includes a portion 124 covering the first photoresist pattern and a portion 122 located in the first opening 1610.

For example, a spin coating process may be used to coat the 15 mg/ml second quantum dot solution on the side of the first photoresist pattern away from the base substrate to form the second quantum dot light-emitting material layer; and a rotation speed of the above-described spin coating process is about 2,500 rpm.

Figure 3C:
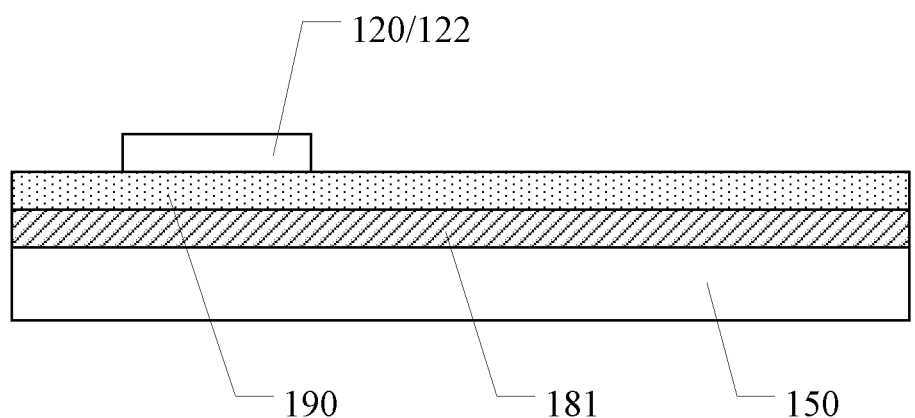

As illustrated in FIG. 3C, the first photoresist pattern 161 is lifted off, the portion 124 of the second quantum dot light-emitting material layer 120 that covers the first photoresist pattern 161 is removed; and the portion 122 of the second quantum dot light-emitting material layer 120 that is located in the first opening 161 remains, to form the second quantum dot light-emitting layer 122.

In the manufacturing method of the quantum dot light-emitting structure, at least one of the ultrasonic lift-off process and the polar aprotic solvent boiling process may be used to lift off the first photoresist pattern; when the first photoresist pattern is lifted off, the second quantum dot light-emitting material layer formed on the first photoresist pattern is also lifted off together, while the portion of the second quantum dot light-emitting material layer that is located in the first opening remains on the base substrate, thereby implementing patterning of the second quantum dot light-emitting material layer.

For example, in the above-described ultrasonic lift-off process, an ultrasonic wave has power about 30 W, and duration about 90 seconds.

For example, the above-described second quantum dot light-emitting layer may be a quantum dot light-emitting layer with higher stability, for example, a quantum dot light-emitting layer emitting red light.

In some examples, the manufacturing method of the quantum dot light-emitting structure further includes: forming a second photoresist pattern on the base substrate on which the second quantum dot light-emitting layer is formed, the second photoresist pattern including a second opening; providing third quantum dot solution; coating the third quantum dot solution on the base substrate on which the second quantum dot light-emitting layer is formed to form a third quantum dot light-emitting material layer, the third quantum dot light-emitting material layer including a portion covering the second photoresist pattern and a portion located in the second opening; and lifting off the second photoresist pattern, so that a portion of the third quantum dot light-emitting material layer that covers the second photoresist pattern is removed, and a portion of the third quantum dot light-emitting material layer that is located in the second opening remains, to form a third quantum dot light-emitting layer. The base substrate on which the second quantum dot light-emitting layer and the third quantum dot light-emitting layer are formed is the base substrate. Therefore, the manufacturing method may perform a lift-off process with photoresist, to pattern the third quantum dot light-emitting layer.

Figure 3D:
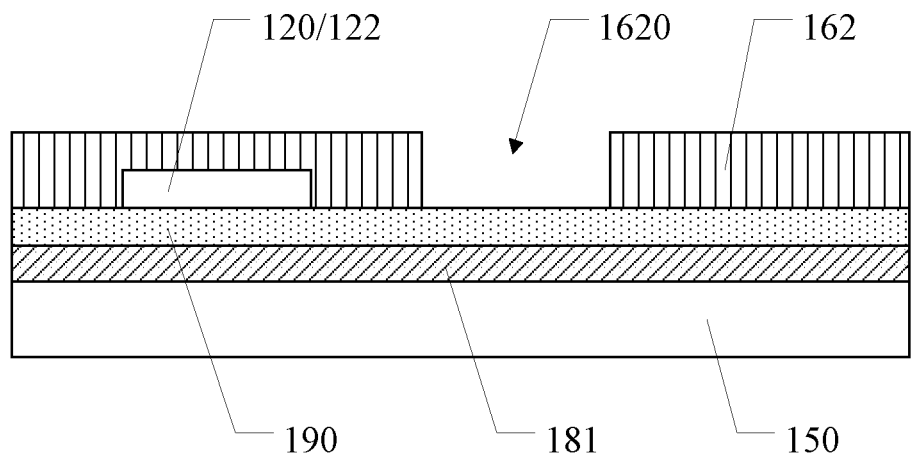

As illustrated in FIG. 3D, the second photoresist pattern 162 is formed on the base substrate 150 on which the second quantum dot light-emitting layer 112 is formed; and the second photoresist pattern 162 includes the second opening 1620.

Similarly, the above-described second photoresist pattern may be a negative photoresist material. In addition, the second photoresist pattern may also be prepared by coating a photoresist material layer, and then performing exposure and development. For specific parameters of the coating, exposure, and development processes as described above, the description of the first photoresist pattern may be referred to, and no details will be repeated here.

Figure 3E:
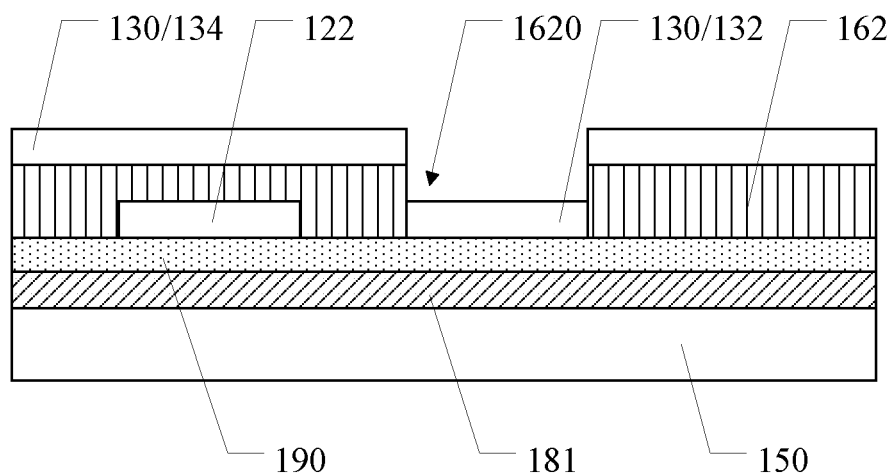

As illustrated in FIG. 3E, the third quantum dot solution is provided; the third quantum dot solution is coated on the base substrate 150 on which the second quantum dot light-emitting layer 122 is formed, to form the third quantum dot light-emitting material layer 130, and the third quantum dot light-emitting material layer 130 includes a portion 134 covering the second photoresist pattern 162 and a portion 132 located in the second opening 1620.

Similarly, a spin coating process may also be used to coat the 15 mg/ml third quantum dot solution on the side of the second photoresist pattern away from the base substrate, to form the third quantum dot light-emitting material layer; and a rotation speed of the above-described spin coating process is about 2,500 rpm.

Figure 3F:
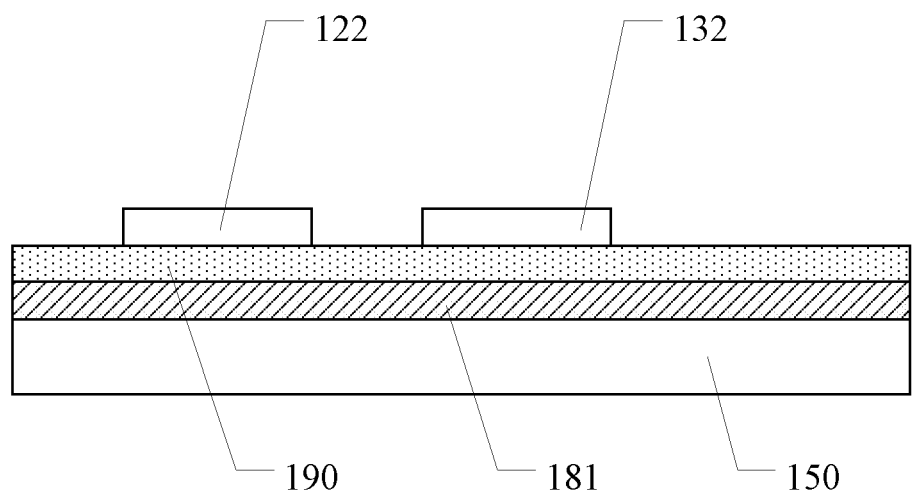

As illustrated in FIG. 3F, the second photoresist pattern 162 is lifted off, the portion 134 of the third quantum dot light-emitting material layer 130 that covers the second photoresist pattern 162 is removed; and the portion 132 of the third quantum dot light-emitting material layer 130 that is located in the second opening 1620 remains, to form the third quantum dot light-emitting layer 132.

For example, at least one of the ultrasonic lift-off process and the polar aprotic solvent boiling process may also be used to lift off the second photoresist pattern; when the second photoresist pattern is lifted off, the third quantum dot light-emitting material layer formed on the second photoresist pattern is also lifted off together, while the portion of the third quantum dot light-emitting material layer that is located in the second opening remains on the base substrate, thereby implementing patterning of the third quantum dot light-emitting layer.

For example, the above-described third quantum dot light-emitting layer may be a quantum dot light-emitting layer with relatively high stability, for example, a quantum dot light-emitting layer emitting green light. Therefore, the quantum dot light-emitting structure prepared by the manufacturing method of the quantum dot light-emitting structure may implement full-color display.

In some examples, the second quantum dot solution includes a second quantum dot which surface is modified with a second ligand; the third quantum dot solution includes a third quantum dot which surface is modified with a third ligand; the second ligand and the third ligand both include photodegradable chemical bonds; and the manufacturing method of the quantum dot light-emitting structure further includes: irradiating the substrate on which the second quantum dot light-emitting layer and the third quantum dot light-emitting layer are formed, so that the photodegradable chemical bonds in the second ligand and the third ligand are broken, changing the second ligand from a long-chain structure to a short-chain structure, thereby making the second quantum dot light-emitting layer and the third quantum dot light-emitting layer insoluble in the above-described first rinsing solvent. Therefore, the manufacturing method of the quantum dot light-emitting structure may prevent a subsequent rinsing process from adversely affecting the second quantum dot light-emitting layer and the third quantum dot light-emitting layer.

In some examples, both the second quantum dot and the third quantum dot may be CdSe/ZnS quantum dots. Of course, the embodiment of the present disclosure includes but is not limited thereto; the second quantum dot and the third quantum dot may also be quantum dots of other materials; and for details, the related description of the first quantum dot may be referred to.

In some examples, before the forming the first quantum dot light-emitting material layer on the base substrate, the manufacturing method further includes: forming a first sacrificial layer on the base substrate; forming a third photoresist pattern on a side of the first sacrificial layer away from the base substrate, the third photoresist pattern including a third opening; patterning the first sacrificial layer with the third photoresist pattern as a mask, and removing a portion of the first sacrificial layer that is located in the third opening; providing second quantum dot solution; coating the second quantum dot solution on a side of the third photoresist pattern away from the base substrate to form a second quantum dot light-emitting material layer, the second quantum dot light-emitting material layer including a portion covering the third photoresist pattern and a portion located in the third opening; and lifting off the third photoresist pattern and the first sacrificial layer, so that the portion of the second quantum dot light-emitting material layer that covers the third photoresist pattern is removed, and the portion of the second quantum dot light-emitting material layer that is located in the third opening remains, to form a second quantum dot light-emitting layer.

It should be noted that, due to the above-described lift-off process, the photoresist may still have certain residue on the base substrate. Therefore, the manufacturing method of the quantum dot light-emitting structure provided by the embodiment of the present disclosure is not limited to the above-described lift-off process directly using photoresist; instead, a sacrificial layer may also be formed on a side of the photoresist pattern close to the base substrate, to improve lift-off effect.

FIG. 4A to FIG. 4J are schematic diagrams of steps of another manufacturing method of a quantum dot light-emitting structure provided by an embodiment of the present disclosure.

Figure 4A:
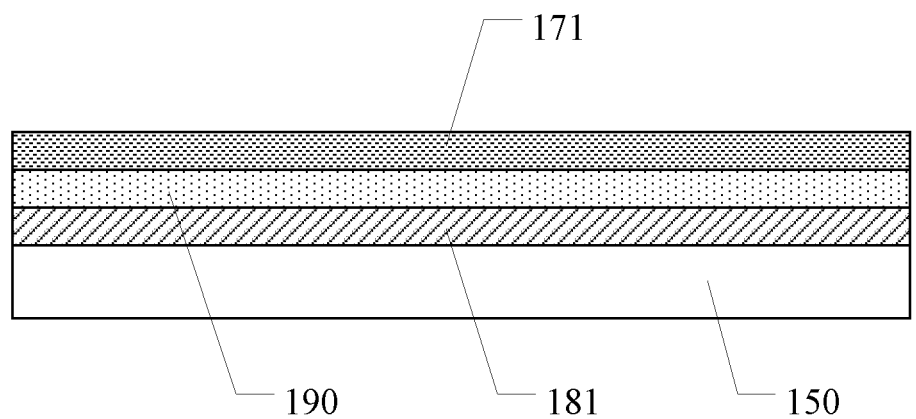
FIG. 4A to FIG. 4J are schematic diagrams of steps of another manufacturing method of a quantum dot light-emitting structure provided by an embodiment of the present disclosure.

As illustrated in FIG. 4A, before the forming the first quantum dot light-emitting material layer on the base substrate, the manufacturing method of the quantum dot light-emitting structure further includes: forming a first sacrificial layer 171 on the base substrate 150.

For example, a material of the first sacrificial layer may be an alcohol-soluble polymer, for example, polyvinylpyrrolidone.

For example, 30 mg/ml polyvinylpyrrolidone solution may be coated on the base substrate 150 by a spin coating process and stands for about 5 minutes to form the first sacrificial layer; and a rotation speed of the above-described spin coating process may be within a range of 1,200 to 1,700 rpm, for example, 1,500 rpm.

Figure 4B:
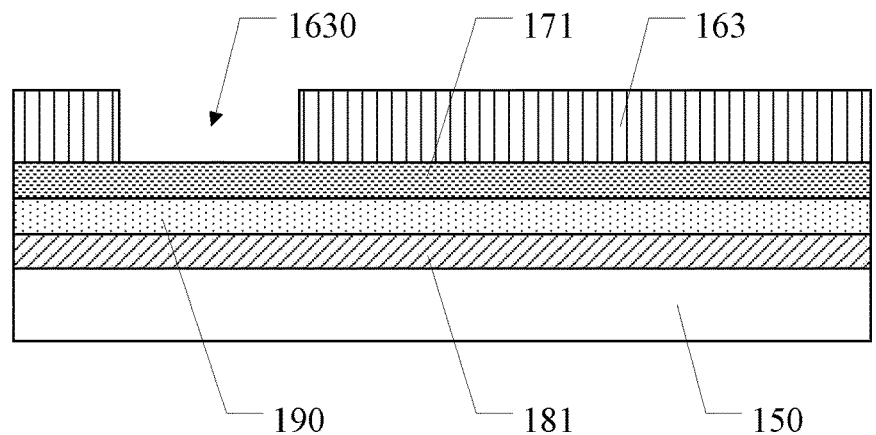

As illustrated in FIG. 4B, a third photoresist pattern 163 is formed on a side of the first sacrificial layer 171 away from the base substrate 150, and the third photoresist pattern 163 includes a third opening 1630.

Similarly, the above-described third photoresist pattern may be made of a negative photoresist material. In addition, the third photoresist pattern may also be prepared by coating a photoresist material layer, and then performing exposure and development. For specific parameters of the coating, exposure, and development processes as described above, the description of the first photoresist pattern may be referred to, and no details will be repeated here.

Figure 4C:
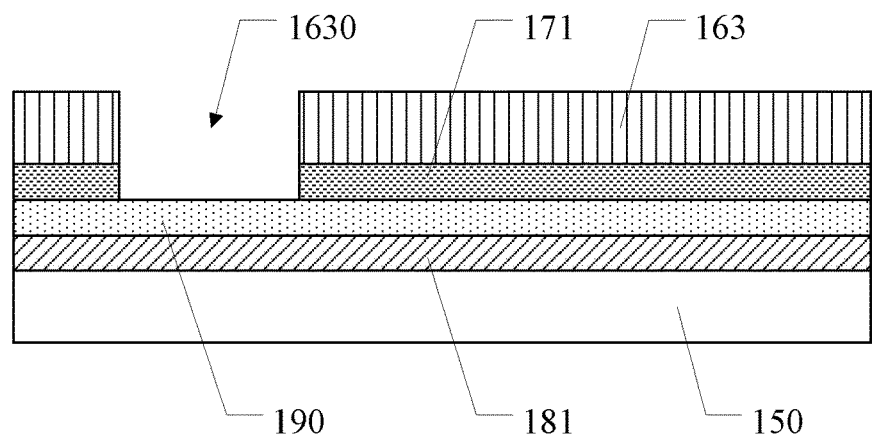

As illustrated in FIG. 4C, the first sacrificial layer 171 is patterned with the third photoresist pattern 1630 as a mask, and the portion of the first sacrificial layer 171 that is located in the third opening 1630 is removed, so that the first sacrificial layer 171 has a same pattern as the third photoresist pattern 1630.

For example, the portion of the first sacrificial layer 171 that is located in the third opening 1630 may be removed by an etching process.

Figure 4D:
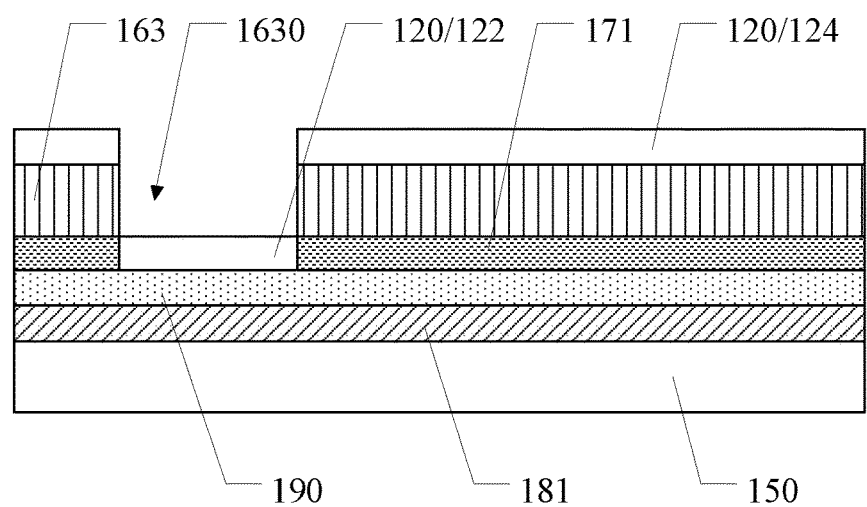

As illustrated in FIG. 4D, the second quantum dot solution is provided; the second quantum dot solution is coated on the side of the third photoresist pattern 163 away from the base substrate 150 to form the second quantum dot light-emitting material layer 120; and the second quantum dot light-emitting material layer 120 includes a portion 124 covering the third photoresist pattern 163 and a portion 122 located in the third opening 1630.

Figure 4E:
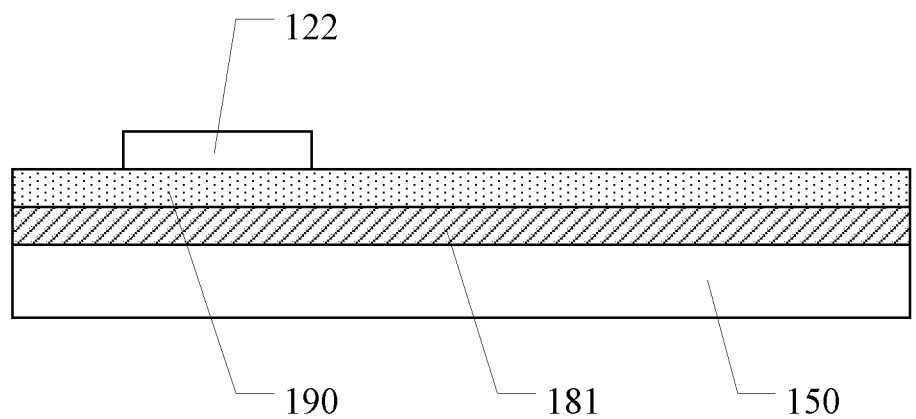

As illustrated in FIG. 4E, the third photoresist pattern 163 and the first sacrificial layer 171 are lifted off; the portion 124 of the second quantum dot light-emitting material layer 120 that covers the third photoresist pattern 163 is removed; and the portion 122 of the second quantum dot light-emitting material layer 120 that is located in the third opening 1630 remains, to form the second quantum dot light-emitting layer 122.

In the manufacturing method of the quantum dot light-emitting structure, the first sacrificial layer may also be lifted off by an ultrasonic lift-off process; when the first sacrificial layer is lifted off, the third photoresist pattern and the second quantum dot light-emitting material layer formed on the first sacrificial layer are also lifted off together, while the portion of the second quantum dot light-emitting material layer that is located in the third opening remains on the base substrate, thereby implementing patterning of the second quantum dot light-emitting layer. In addition, since the lift-off process of the sacrificial layer will not form residue on the base substrate, a product yield and performance of the quantum dot light-emitting structure may be improved.

Figure 4F:
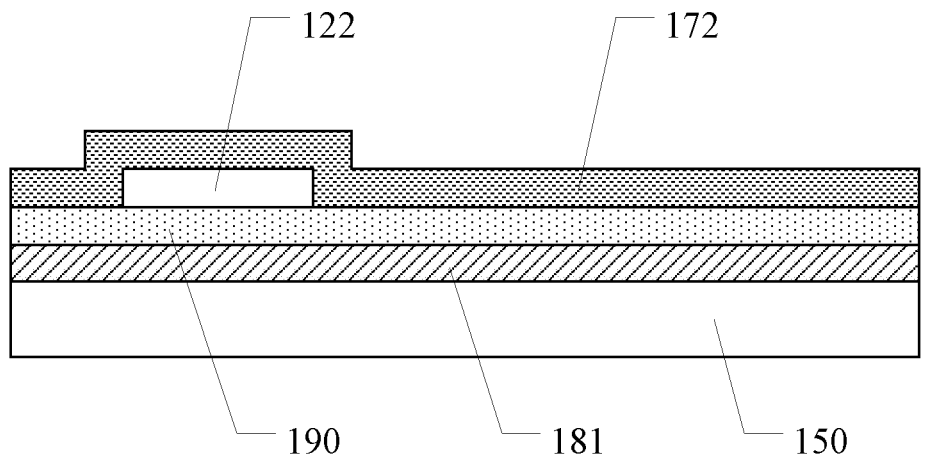

As illustrated in FIG. 4F, the manufacturing method of the quantum dot light-emitting structure further includes forming a second sacrificial layer 172 on the base substrate 150 on which the second quantum dot light-emitting layer 122 is formed.

For example, a material of the second sacrificial layer may be an alcohol-soluble polymer, for example, polyvinylpyrrolidone. It should be noted that, the second sacrificial layer and the first sacrificial layer may be made of a same material or may also be made of different materials.

Figure 4G:
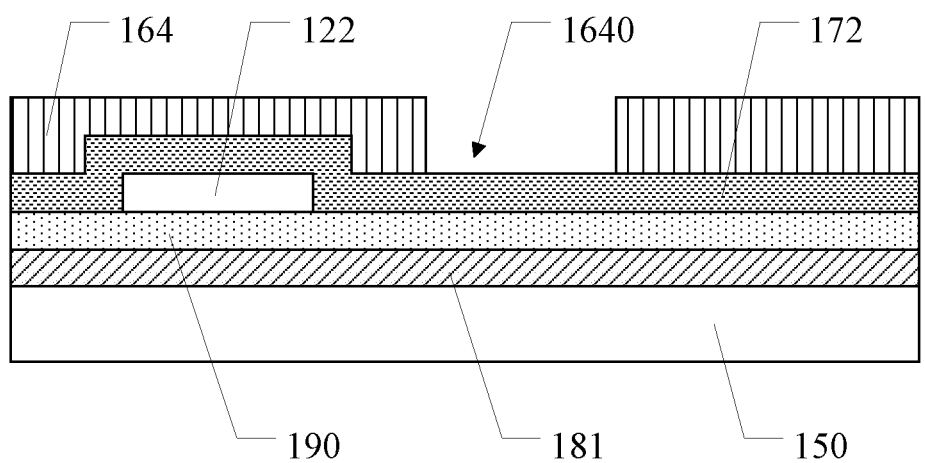

As illustrated in FIG. 4G, a fourth photoresist pattern 164 is formed on a side of the second sacrificial layer 172 away from the base substrate 150, and the fourth photoresist pattern 164 includes a fourth opening 1640.

Similarly, the above-described fourth photoresist pattern may be made of a negative photoresist material. In addition, the fourth photoresist pattern may also be prepared by coating a photoresist material layer, and then performing exposure and development. For specific parameters of the coating, exposure, and development processes as described above, the description of the first photoresist pattern may be referred to, and no details will be repeated here.

Figure 4H:
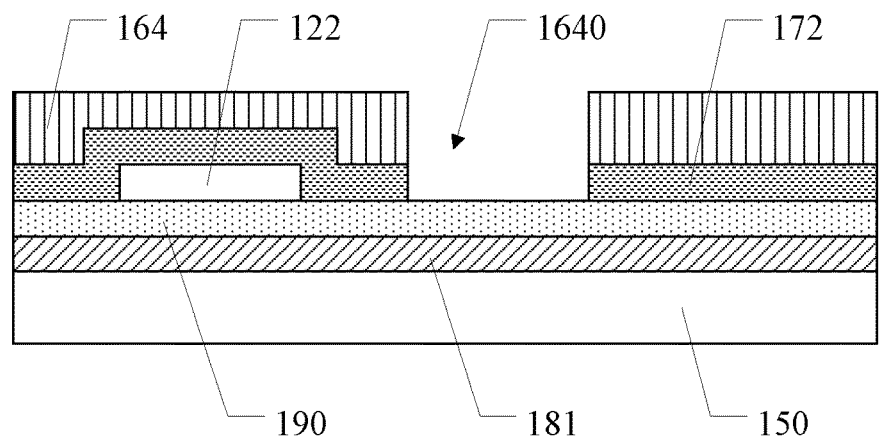

As illustrated in FIG. 4H, the second sacrificial layer 172 is patterned with the fourth photoresist pattern 1640 as a mask, and the portion of the second sacrificial layer 172 that is located in the fourth opening 1640 is removed.

Figure 4I:
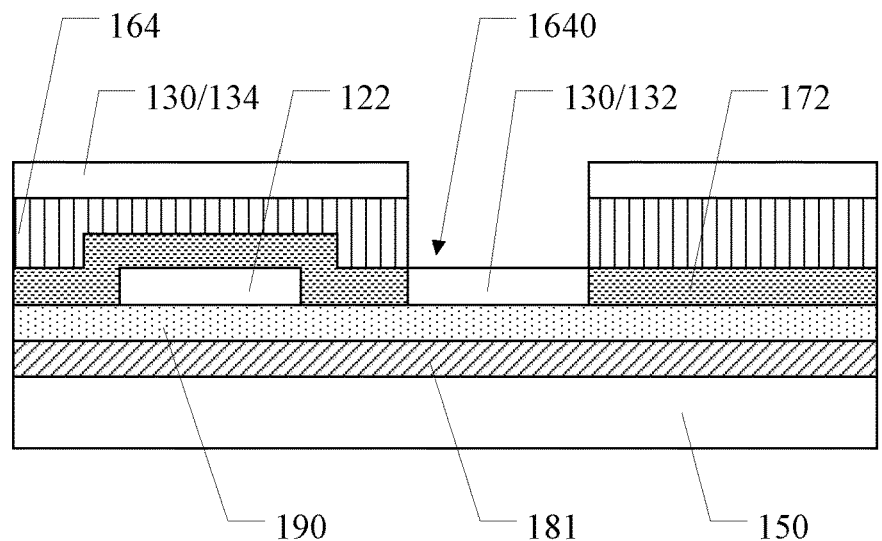

As illustrated in FIG. 4I, the third quantum dot solution is provided, the third quantum dot solution is coated on the base substrate 150 on which the second quantum dot light-emitting layer 122 is formed, to form the third quantum dot light-emitting material layer 130, and the third quantum dot light-emitting material layer 130 includes a portion 134 covering the fourth photoresist pattern 164 and a portion 132 located in the fourth opening 1640.

Figure 4J:
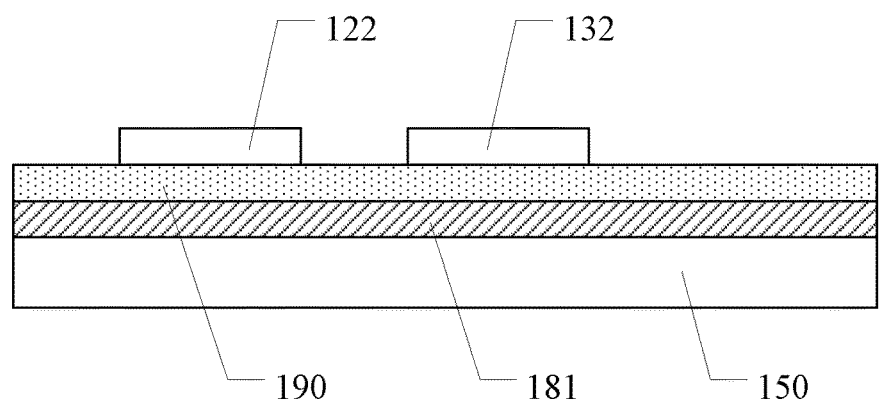

As illustrated in FIG. 4J, the fourth photoresist pattern 164 and the second sacrificial layer 172 are lifted off, the portion of the third quantum dot light-emitting material layer 130 that covers the fourth photoresist pattern 164 is removed, the portion 132 of the third quantum dot light-emitting material layer 130 that is located in the fourth opening 1640 remains, to form the third quantum dot light-emitting layer 132, and the base substrate 150 on which the second quantum dot light-emitting layer 122 and the third quantum dot light-emitting layer 132 are formed is the base substrate 150.

In the manufacturing method of the quantum dot light-emitting structure, the second sacrificial layer may also be lifted off by an ultrasonic lift-off process; when the second sacrificial layer is lifted off, the fourth photoresist pattern and the third quantum dot light-emitting material layer formed on the second sacrificial layer are also lifted off together, while the portion of the third quantum dot light-emitting material layer that is located in the fourth opening remains on the base substrate, thereby implementing patterning of the third quantum dot light-emitting layer. In addition, since the lift-off process of the sacrificial layer will not form residue on the base substrate, a product yield and performance of the quantum dot light-emitting structure may be improved.

Similarly, in the above-described manufacturing method of the quantum dot light-emitting structure by using the sacrificial layer, the second quantum dot solution includes a second quantum dot which surface is modified with a second ligand; the third quantum dot solution includes a third quantum dot which surface is modified with a third ligand; the second ligand and the third ligand both include photodegradable chemical bonds; and the manufacturing method of the quantum dot light-emitting structure further includes: irradiating the substrate on which the second quantum dot light-emitting layer and the third quantum dot light-emitting layer are formed, to break the photodegradable chemical bonds in the second ligand and the third ligand, so as to change the second ligand from a long-chain structure to a short-chain structure, so that the second quantum dot light-emitting layer and the third quantum dot light-emitting layer is insoluble in the above-described first rinsing solvent. Therefore, the manufacturing method of the quantum dot light-emitting structure may prevent a subsequent rinsing process from adversely affecting the second quantum dot light-emitting layer and the third quantum dot light-emitting layer. For example, a material of the above-described second ligand and the third ligand may be amine-based ligands, carboxyl-based ligands, and sulfhydryl-based ligands, etc., and the above-described photodegradable chemical bonds include peroxy bonds, persulfide bonds, azo bonds, etc.

It should be noted that the manufacturing method of the quantum dot light-emitting structure provided by the embodiment of the present disclosure is not limited to implementing patterning of the second quantum dot light-emitting layer and the third quantum dot light-emitting layer by the above-described lift-off process with the photoresist, but patterning of the second quantum dot light-emitting layer and the third quantum dot light-emitting layer may also be implemented by using the above-described photo-ligand remover, exposure process and rinsing process, that is, the first quantum dot light-emitting layer, the second quantum dot light-emitting layer and the third quantum dot light-emitting layer are all prepared by using the above-described photo-ligand remover, exposure process and rinsing process.

In some examples, before the forming the first sacrificial layer or the first photoresist pattern on the base substrate, the manufacturing method of the quantum dot light-emitting structure further includes: sequentially forming a first electrode and an electron transport layer on the base substrate. For example, a material of the first electrode may be a conductive metal oxide, for example, Indium Tin Oxide (ITO). A material of the electron transport layer may be Zinc Oxide (ZnO).

For example, the above-described zinc oxide thin film may be formed by a deposition process or a sputtering process.

In some examples, after the first quantum dot light-emitting layer is formed on the base substrate, the manufacturing method of the quantum dot light-emitting structure further includes: sequentially forming a hole transport layer and a second electrode on the base substrate on which the first quantum dot light-emitting layer is formed, and a material of the second electrode may be metal, for example, silver. In this case, the first electrode is a cathode, and the second electrode is an anode. Of course, the embodiment of the present disclosure includes but is not limited thereto; the first electrode may also be a cathode, and the second electrode may also be an anode; other structures of the quantum dot light-emitting structure may adopt common designs.

In some examples, the manufacturing method of the quantum dot light-emitting structure further includes: annealing the base substrate on which the second quantum dot light-emitting layer and the third quantum dot light-emitting layer are formed; a temperature of annealing treatment being in a range of 80 to 180 degrees Celsius, for example, 120 degrees Celsius, and duration of annealing treatment being in a range of 5 to 30 minutes, for example, 20 minutes. Therefore, the second quantum dot light-emitting layer and the third quantum dot light-emitting layer formed by using the manufacturing method of the quantum dot light-emitting structure have better stability and luminous efficiency.

Figure 5:
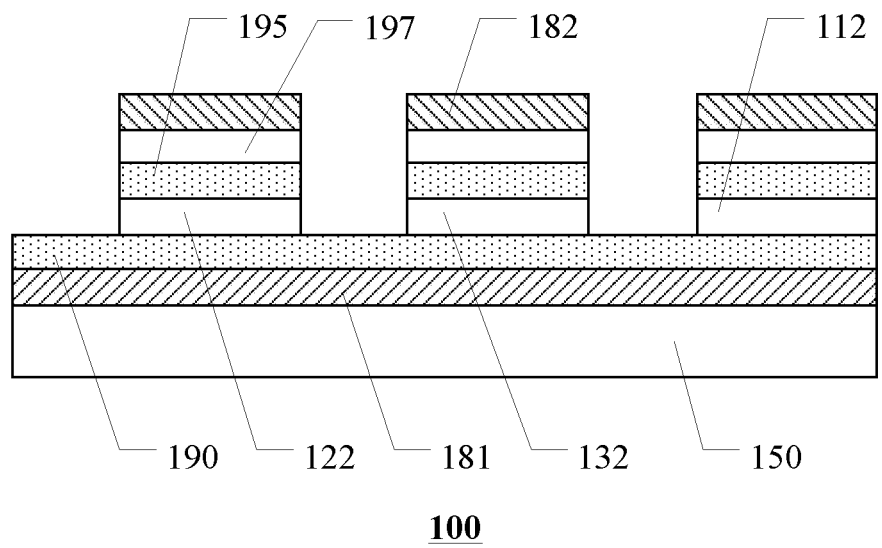
FIG. 5 is a structural schematic diagram of a quantum dot light-emitting structure provided by an embodiment of the present disclosure.

An embodiment of the present disclosure further provides a quantum dot light-emitting structure. FIG. 5 is a structural schematic diagram of a quantum dot light-emitting structure provided by an embodiment of the present disclosure. As illustrated in FIG. 5, the quantum dot light-emitting structure is a quantum dot light-emitting structure manufactured by any one of the above-described manufacturing method of the quantum dot light-emitting structure. Therefore, the quantum dot light-emitting structure can ensure complete morphology of the first quantum dot light-emitting layer and can further ensure light-emitting performance of the quantum dot light-emitting structure. In addition, since the first quantum dot light-emitting layer may be directly patterned by an exposure process, it may have higher precision with a smaller size, so that the quantum dot light-emitting structure may have higher resolution.

For example, as illustrated in FIG. 5, the quantum dot light-emitting structure 100 includes: a base substrate 150; a first quantum dot light-emitting layer 112, located on the base substrate 150; and a second quantum dot light-emitting layer 122, located on the base substrate 150. A ligand content of the first quantum dot light-emitting layer 112 is less than 60% of a ligand content of the second quantum dot light-emitting layer 122. For example, the ligand content of the first quantum dot light-emitting layer 112 is 50% of the ligand content of the second quantum dot light-emitting layer 122. During formation of the first quantum dot light-emitting layer, a photo-ligand remover releases a ligand remover under irradiation by an exposure process, so as to remove a first ligand from an exposed portion of a first quantum dot light-emitting material layer, so that the exposed portion of the first quantum dot light-emitting material layer is insoluble in a first rinsing solvent, to remain on the base substrate and form the first quantum dot light-emitting layer. Therefore, the ligand content in the finally formed first quantum dot light-emitting layer is relatively small. It should be noted that, the above-described ligand content refers to a percentage of a mass of the ligand to a mass of the entire quantum dot light-emitting layer.

In some examples, the first quantum dot light-emitting layer includes a first quantum dot which surface is modified with a first ligand, a first quantum dot which surface is not modified with a ligand, and a photo-ligand remover. That is to say, there is still first quantum dots which first ligand has not been removed by the ligand remover and a residual photo-ligand remover in the first quantum dot light-emitting layer.

In some examples, the photo-ligand remover includes a photoacid generator. The photoacid generator generates hydrogen ions after being irradiated, and the hydrogen ions combine with the first ligand, thereby removing the first ligand from the exposed portion of the first quantum dot light-emitting material layer. On the other hand, using the photoacid generator to remove the first ligand may also avoid affecting luminous efficiency of the first quantum dots. Of course, the embodiment of the present disclosure includes but is not limited thereto, and the photo-ligand remover may also be other material that can remove the first ligand from the first quantum dot.

For example, the photoacid generator includes at least one of triazine-based compounds, iodonium salt-based compounds, sulfonium-based compounds, and perfluorobutyl-based compounds.

In some examples, the first quantum dot light-emitting layer is configured to emit blue light, and the second quantum dot light-emitting layer is configured to emit red light (light with a wavelength ranging from 622 to 770 nanometers) or green light (light with a wavelength ranging from 492 to 577 nanometers).

In some examples, as illustrated in FIG. 5, the quantum dot light-emitting structure 100 further includes: a first electrode 181 and an electron transport layer 190 located on the base substrate 150 and arranged sequentially. For example, a material of the first electrode may be a conductive metal oxide, for example, Indium Tin Oxide (ITO). A material of the electron transport layer may be Zinc Oxide (ZnO).

For example, the above-described zinc oxide thin film may be formed by a deposition process or a sputtering process.

In some examples, as illustrated in FIG. 5, the quantum dot light-emitting structure 100 further includes: a hole transport layer 195 and a hole injection layer 197 located on a side of the respective quantum dot light-emitting layers 112, 122, 132 away from the base substrate 150, and a second electrode 182 located on a side of the hole transport layer 195 away from the base substrate 150. A material of the second electrode may be metal, for example, silver.

Figure 6:
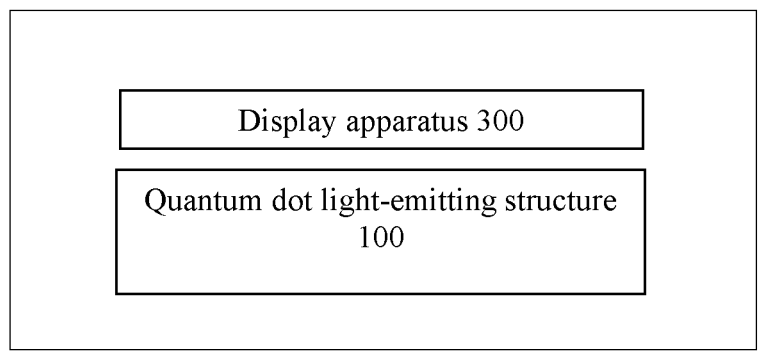
FIG. 6 is a schematic diagram of a display apparatus provided by an embodiment of the present disclosure.

At least one embodiment of the present disclosure further provides a display apparatus. FIG. 6 is a schematic diagram of a display apparatus provided by an embodiment of the present disclosure. As illustrated in FIG. 6, the display apparatus 300 includes any one of the above-described quantum dot light-emitting structures 100. Therefore, the display apparatus also has higher light-emitting performance and higher resolution. For details, the related description of the quantum dot light-emitting structure may be referred to, and no details will be repeated here.

For example, the display apparatus may be a television, an electronic picture frame, an electronic album, a computer, a laptop, a tablet personal computer, a navigator, a smart phone, or any other electronic product having a display function.

There are some points to be explained:

(1) In the drawings of the embodiments of the present disclosure, only structures related with the embodiments of the present disclosure are referred to, and for other structures, reference may be made to common designs.

(2) In case of no conflict, features in the same embodiment and different embodiments of the present disclosure may be combined with each other.

The foregoing descriptions are merely exemplary embodiments of the present disclosure and are not intended to limit the protection scope of the present disclosure. The protection scope of the present disclosure is determined by the appended claims.

The invention claimed is:

1. A manufacturing method of a quantum dot light-emitting structure, comprising:
    providing first quantum dot solution, the first quantum dot solution comprising a first quantum dot which surface is modified with a first ligand and a photo-ligand remover, and the first ligand being dissolved in a first rinsing solvent;
    coating the first quantum dot solution on a base substrate to form a first quantum dot light-emitting material layer;
    partially exposing the first quantum dot light-emitting material layer, so that the first quantum dot light-emitting material layer comprises an exposed portion and an unexposed portion, the photo-ligand remover being configured to release a ligand remover under irradiation, to remove the first ligand in the exposed portion of the first quantum dot light-emitting material layer; and
    developing and rinsing the exposed first quantum dot light-emitting material layer by using the first rinsing solvent, to form the first quantum dot light-emitting layer,
    the method further comprises: providing second quantum dot solution, the second quantum dot solution comprising a second quantum dot which surface is modified with a second ligand and a photo-ligand remover, and the second ligand being dissolved in a second rinsing solvent;

coating the second quantum dot solution on a base substrate on which the first quantum dot light-emitting layer is formed to form a second quantum dot light-emitting material layer;

partially exposing the second quantum dot light-emitting material layer, so that the second quantum dot light-emitting material layer comprises an exposed portion and an unexposed portion, the photo-ligand remover being configured to release a ligand remover under irradiation, to remove the second ligand in the exposed portion of the second quantum dot light-emitting material layer; and developing and rinsing the exposed second quantum dot light-emitting material layer by using the second rinsing solvent, to form the second quantum dot light-emitting layer, wherein a first ligand content of the first quantum dot light-emitting layer is less than 60% of a second ligand content of the second content dot light-emitting layer, the first quantum dot light-emitting layer is configured to emit light with a wavelength ranging from 455 to 492 nanometers, and the second quantum dot light-emitting layer is configured to emit light with a wavelength ranging from 622 to 770 nanometers or light with a wavelength ranging from 492 to 577 nanometers.

2. The manufacturing method of the quantum dot light-emitting structure according to claim 1, wherein the photo-ligand remover comprises a photoacid generator.

3. The manufacturing method of the quantum dot light-emitting structure according to claim 2, wherein the photoacid generator comprises at least one of triazine-based compounds, iodonium salt-based compounds, sulfonium-based compounds, and perfluorobutyl-based compounds.

4. The manufacturing method of the quantum dot light-emitting structure according to claim 2, wherein, in the first quantum dot solution, a mass percentage ratio of the photo-ligand remover to the first quantum dot which surface is modified with the first ligand is in a range of 4% to 6%.

5. The manufacturing method of the quantum dot light-emitting structure according to claim 1, wherein the first rinsing solvent comprises at least one of aromatic hydrocarbons comprising toluene, xylene, and chlorobenzene.

6. The manufacturing method of the quantum dot light-emitting structure according to claim 1, wherein the partially exposing the first quantum dot light-emitting material layer comprises:

partially exposing the first quantum dot light-emitting material layer with ultraviolet light, to form the exposed portion and the unexposed portion, energy of the ultraviolet light being within a range of 90 mJ/cm2 to 500 mJ/cm2.

7. The manufacturing method of the quantum dot light-emitting structure according to claim 1, further comprising:

annealing the base substrate on which the first quantum dot light-emitting layer is formed, a temperature of the annealing treatment being in a range of 80 to 180 degrees Celsius, and duration of the annealing treatment being in a range of 5 to 30 minutes.

8. The manufacturing method of the quantum dot light-emitting structure according to claim 1, wherein a material of the second ligand and a material of the first ligand are the same, and a material of the second rinsing solvent and a material of the first rinsing solvent are the same.

9. The manufacturing method of the quantum dot light-emitting structure according to claim 1, wherein before the forming the first quantum dot light-emitting material layer on the base substrate, the manufacturing method further comprises:

forming a first photoresist pattern on the base substrate, the first photoresist pattern comprising a first opening;

providing second quantum dot solution;

coating the second quantum dot solution on a side of the first photoresist pattern away from the base substrate to form a second quantum dot light-emitting material layer, the second quantum dot light-emitting material layer comprising a portion covering the first photoresist pattern and a portion located in the first opening; and lifting off the first photoresist pattern, so that a portion of the second quantum dot light-emitting material layer that covers the first photoresist pattern is removed, and a portion of the second quantum dot light-emitting material layer that is located in the first opening remains, to form a second quantum dot light-emitting layer.

10. The manufacturing method of the quantum dot light-emitting structure according to claim 8, further comprising:

forming a second photoresist pattern on the base substrate on which the second quantum dot light-emitting layer is formed, the second photoresist pattern comprising a second opening;

providing third quantum dot solution;

coating the third quantum dot solution on the base substrate on which the second quantum dot light-emitting layer is formed to form a third quantum dot light-emitting material layer, the third quantum dot light-emitting material layer comprising a portion covering the second photoresist pattern and a portion located in the second opening; and lifting off the second photoresist pattern, so that the portion of the third quantum dot light-emitting material layer that covers the second photoresist pattern is removed, and the portion of the third quantum dot light-emitting material layer that is located in the second opening remains, to form a third quantum dot light-emitting layer.

11. The manufacturing method of the quantum dot light-emitting structure according to claim 10, wherein the second quantum dot light-emitting layer is configured to emit light with a wavelength ranging from 622 to 770 nanometers, and the third quantum dot light-emitting layer is configured to emit light with a wavelength ranging from 492 to 577 nanometers.

12. The manufacturing method of the quantum dot light-emitting structure according to claim 10, wherein the second quantum dot solution comprises a second quantum dot which surface is modified with a second ligand, the third quantum dot solution comprises a third quantum dot which surface is modified with a third ligand, the second ligand and the third ligand both comprise photodegradable chemical bonds, and the manufacturing method further comprises:

irradiating the substrate on which the second quantum dot light-emitting layer and the third quantum dot light-emitting layer are formed, so that the photodegradable chemical bonds in the second ligand and the third ligand are broken.

13. The manufacturing method of the quantum dot light-emitting structure according to claim 10, wherein the lifting off the first photoresist pattern or the second photoresist pattern comprises:

lifting off the first photoresist pattern or the second photoresist pattern by using at least one of an ultrasonic lift-off process and a polar aprotic solvent boiling process.

14. The manufacturing method of the quantum dot light-emitting structure according to claim 1, wherein before the forming the first quantum dot light-emitting material layer on the base substrate, the manufacturing method further comprises:

forming a first sacrificial layer on the base substrate;

forming a third photoresist pattern on a side of the first sacrificial layer away from the base substrate, the third photoresist pattern comprising a third opening;

patterning the first sacrificial layer with the third photoresist pattern as a mask, and removing a portion of the first sacrificial layer that is located in the third opening;

providing second quantum dot solution;

coating the second quantum dot solution on a side of the third photoresist pattern away from the base substrate to form a second quantum dot light-emitting material layer, the second quantum dot light-emitting material layer comprising a portion covering the third photoresist pattern and a portion located in the third opening; and lifting off the third photoresist pattern and the first sacrificial layer, so that the portion of the second quantum dot light-emitting material layer that covers the third photoresist pattern is removed, and the portion of the second quantum dot light-emitting material layer that is located in the third opening remains, to form a second quantum dot light-emitting layer.

15. The manufacturing method of the quantum dot light-emitting structure according to claim 14, further comprising:

forming a second sacrificial layer on the base substrate on which the second quantum dot light-emitting layer is formed;

forming a fourth photoresist pattern on a side of the second sacrificial layer away from the base substrate, the fourth photoresist pattern comprising a fourth opening;

patterning the second sacrificial layer with the fourth photoresist pattern as a mask, and removing the portion of the second sacrificial layer that is located in the fourth opening;

providing third quantum dot solution;

coating the third quantum dot solution on the base substrate on which the second quantum dot light-emitting layer is formed, to form a third quantum dot light-emitting material layer, the third quantum dot light-emitting material layer comprising a portion covering the fourth photoresist pattern and a portion located in the fourth opening, and lifting off the fourth photoresist pattern and the second sacrificial layer, so that the portion of the third quantum dot light-emitting material layer that covers the fourth photoresist pattern is removed, and the portion of the third quantum dot light-emitting material layer that is located in the fourth opening remains, to form the third quantum dot light-emitting layer.

16. A quantum dot light-emitting structure, comprising:

a base substrate;

a first quantum dot light-emitting layer, located on the base substrate; and a second quantum dot light-emitting layer, located on the base substrate, wherein a ligand content of the first quantum dot light-emitting layer is less than 60% of a ligand content of the second quantum dot light-emitting layer, the first quantum dot light-emitting layer is configured to emit light with a wavelength ranging from 455 to 492 nanometers, and the second quantum dot light-emitting layer is configured to emit light with a wavelength ranging from 622 to 770 nanometers or light with a wavelength ranging from 492 to 577 nanometers, wherein the first quantum dot light-emitting layer comprises a first quantum dot which surface is modified with a first ligand, a first quantum dot which surface is not modified with a ligand, and a photo-ligand remover.

17. The quantum dot light-emitting structure according to claim 16, wherein the photo-ligand remover comprises a photoacid generator.

18. The quantum dot light-emitting structure according to claim 17, wherein the photoacid generator comprises at least one of triazine-based compounds, iodonium salt-based compounds, sulfonium-based compounds, and perfluorobutyl-based compounds.

* * * * *